(12) United States Patent
Hendrix et al.

(10) Patent No.: US 7,092,465 B2
(45) Date of Patent: Aug. 15, 2006

(54) METHOD AND APPARATUS FOR PROCESSING AN AMPLITUDE MODULATED (AM) SIGNAL

(75) Inventors: Jon Hendrix, Wimberley, TX (US); Bradley Banks, Austin, TX (US); Charles E. Seaberg, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 770 days.

(21) Appl. No.: 10/294,511

(22) Filed: Nov. 14, 2002

(65) Prior Publication Data
US 2004/0096014 A1 May 20, 2004

(51) Int. Cl.
*H04B 1/10* (2006.01)
(52) U.S. Cl. ............. 375/350; 375/232; 375/285; 375/320
(58) Field of Classification Search ........ 375/350, 375/232, 284, 285, 278, 320, 340; 708/300, 708/311–313; 455/307, 309; 348/725
See application file for complete search history.

(56) References Cited

U.S. PATENT DOCUMENTS

| | | |
|---|---|---|
| 3,760,287 A | 9/1973 | Harris |
| 5,155,862 A | 10/1992 | Hansen |
| 5,493,717 A | 2/1996 | Schwarz |
| 2001/0008430 A1* | 7/2001 | Carr et al. ............... 348/725 |
| 2002/0136289 A1 | 9/2002 | Shukla et al. |

OTHER PUBLICATIONS

Sklar, "Digtial Communications Fundamentals and Applications", published by Prentice-Hall, Inc., in 2001, pp. 1056, 1096-1071.*

* cited by examiner

*Primary Examiner*—Phuong Phu
(74) *Attorney, Agent, or Firm*—Robert L. King; Joanna G. Chiu; Susan C. Hill

(57) ABSTRACT

In order to protect against adjacent channel interference and the effects of weak signal in AM signal processing, pre- and post-AM demodulation filters (36 and 38) may be used where the bandwidth of both is varied in the same manner by a single controlling mechanism (34). In one embodiment, two or more cascaded filters (20, 24 or 22, 26 or 30,32) may be used for the pre- and post-demodulation filters where each of the cascaded filters has a same predetermined order and uses the same set of coefficients. In one embodiment, all cascaded filters are first order IIR filters, which reduces computation complexity. The use of a same set of coefficient for all the cascaded filters results in a same bandwidth for all filters and further reduces computation complexity. In an alternate embodiment, cascaded filters may be used for only one of the pre- and post-demodulator filters.

25 Claims, 3 Drawing Sheets

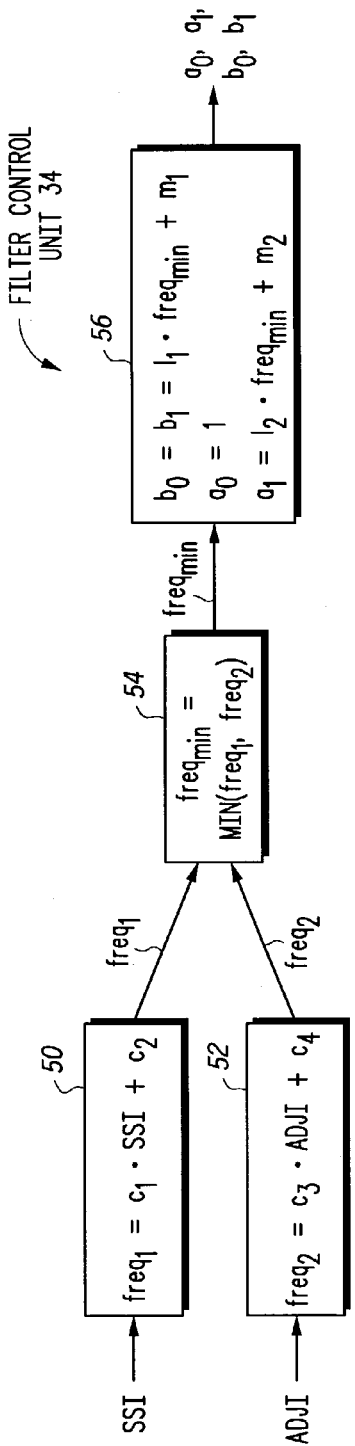
FIG. 2
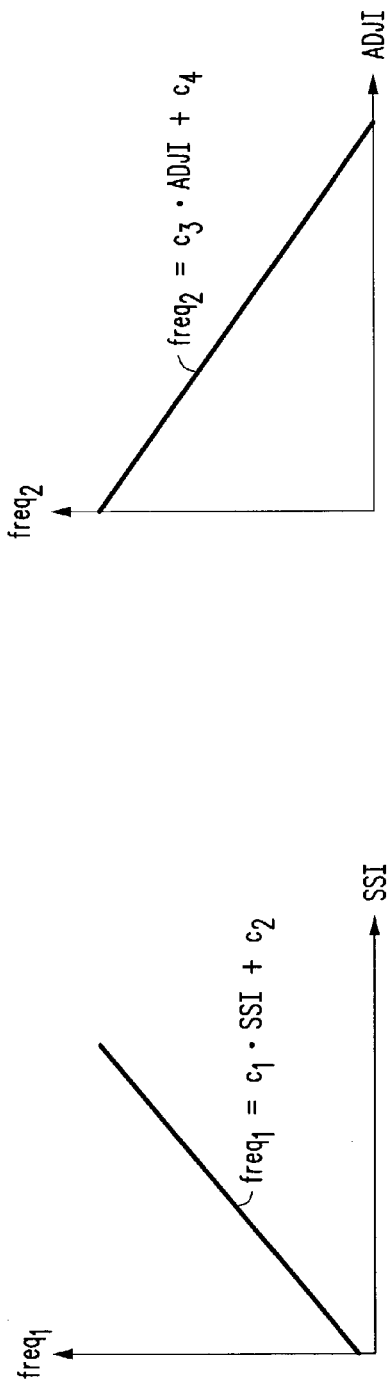
FIG. 4
FIG. 3

METHOD AND APPARATUS FOR PROCESSING AN AMPLITUDE MODULATED (AM) SIGNAL

FIELD OF THE INVENTION

The present invention relates generally to radio receivers, and more specifically, to AM receivers having AM demodulator filters.

RELATED ART

The use of AM radios is increasingly expanding into a variety of applications, such as in digital car radio, cell phones, two-way radios, and short wave radio. However, in amplitude modulation (AM) radio processing, weak signals and interference from adjacent channels introduces undesirable effects which reduce the quality of the resulting audio signal. Therefore, there is a need for improving the quality of the resulting audio signal. Also, it is desirable to reduce processing complexity, power consumption, and memory storage in order to improve efficiency of AM radio processing.

BRIEF DESCRIPTION OF THE DRAWINGS

The present invention is illustrated by way of example and not limited by the accompanying figures, in which like references indicate similar elements, and in which:

FIG. 2 illustrates, in block diagram form, a filter control unit of the AM receiver of FIG. 1 in accordance with one embodiment of the present invention; and FIGS. 3–6 illustrate various graphs used in deriving information used by the filter control unit in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" and "negate" (or "deassert") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

In order to protect against adjacent channel interference and the effects of weak signal, a pair of pre- and post-demodulation filters may be used where the bandwidth of both before and after AM demodulation is varied in the same manner by a single controlling mechanism. In one embodiment, two or more cascaded filters may be used where each of the cascaded filters has a same predetermined order and uses the same set of coefficients. The cascaded filters may be used before, after, or before and after AM demodulation. Therefore, through the use of demodulation filters, adjacent channel interference and effects of weak signal may be reduced.

Figure 1:
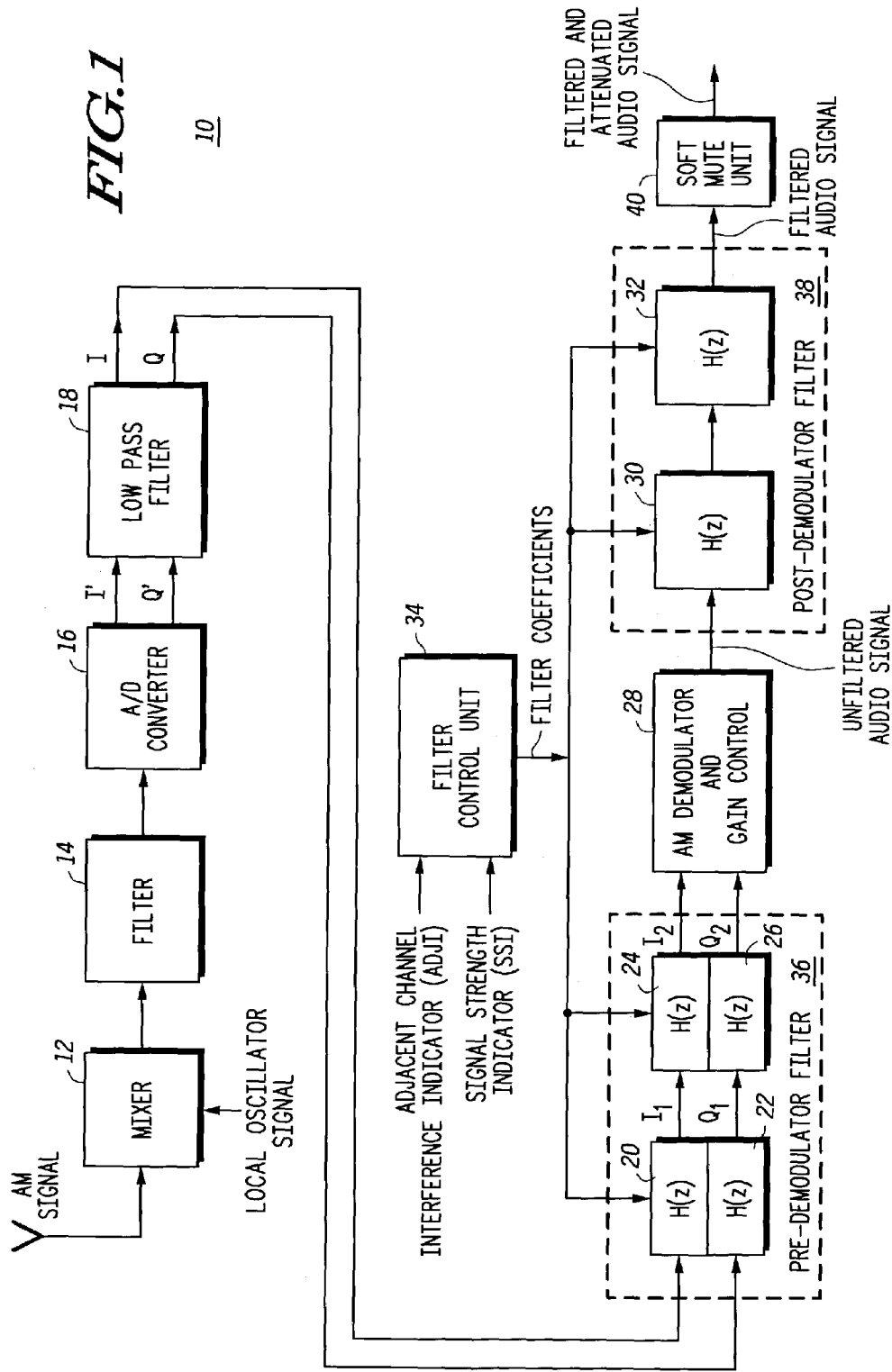
FIG. 1 illustrates, in block diagram form, an AM receiver in accordance with one embodiment of the present invention.

FIG. 1 illustrates, in block diagram form, an AM receiver 10 having a mixer 12, filter 14, A/D converter 16, low pass filter 18, pre-demodulator filter 36, AM demodulator and gain control 28, post-demodulator filter 38, soft mute unit 40, and filter control unit 34. In the illustrated embodiment, an AM signal is received by an antenna and coupled to an input of mixer 12. An output of mixer 12 is coupled to an input of filter 14. An output of filter 14 is coupled to an input of A/D converter 16. An output of A/D converter 16 is coupled to an input of low pass filter 18. An output of low pass filter 18 is coupled to an input of pre-demodulator filter 36. An output of pre-demodulator filter 36 is coupled to an input of AM demodulator and gain control 28. An output of AM demodulator and gain control 28 is coupled to an input of post-demodulator filter 38. An output of post-demodulator filter 38 is coupled to an input of soft mute unit 40. Filter control unit 34 receives an adjacent channel interference indicator (ADJI) and a signal strength indicator (SSI) and provides filter coefficients to pre-demodulator filter 36 and post-demodulator filter 38.

In operation, mixer 12 takes a received input signal (e.g. an amplitude modulated (AM) signal containing a message) from the antenna and multiplies the input signal with a first local oscillator frequency. The resulting product is an intermediate frequency containing both a sum and a difference component. Filter 14, in this embodiment, is a bandpass filter that removes one of the sum component or the difference component and couples the other component to A/D converter 16. A/D converter 16 performs a conversion of the filtered signal to a digital format. In one embodiment, A/D converter 16 also includes a mixer which mixes the digital signal down to baseband such that a baseband signal is provided to low pass filter 18. Alternatively, though, a mixer may be used between filter 14 and A/D converter 16 to mix the output of filter 14 down to baseband such that A/D converter 16 performs a conversion of a baseband filtered signal. In yet another alternate embodiment, mixer 12 may mix the input AM signal from the antenna directly down to baseband. In this alternate embodiment, filter 14 may be a low pass filter 14 which provides a filtered baseband signal to A/D converter 16. Note that in any of these embodiments, a baseband signal is provided to low pass filter 18. Low pass filter 18 functions to digitally filter the signal to improve the signal-to-noise ratio. Therefore, at the output of low pass filter 18, a substantially clean digital filtered baseband signal is provided to pre-demodulator filter 36.

At the output of A/D converter 16, the filtered digital baseband signal is represented as the signals I' and Q' that together are effectively represented by the mathematical expression $A(t)e^{j\theta'}$. That is, I' and Q' are quadrature components which are 90° out of phase with each other. Low pass filter 18 filters both I' and Q' to produce the digital filtered baseband signal that is represented by I and Q, which are input to pre-demodulator filter 36. (Note that signal I, Q may also be referred to as an intermediate signal.) Pre-demodulator filter 36 filters I and Q in order to remove adjacent channel interference and to limit the noise presented to AM demodulator and gain control 28. The AM demodulator portion of AM demodulator and gain control 28 extracts the message from the input baseband signal $I_2$, $Q_2$ received from pre-demodulator filter 36. The gain control portion of AM demodulator and gain control 28 maintains a constant amplitude of the message with changing signal strength. Note that AM demodulator and gain control 28 may be designed to produce the unfiltered audio signal using techniques known in the art, and therefore, will not be described in more detail herein. Post-demodulator filter 38 filters the unfiltered audio signal from AM demodulator and gain control 28 to reduce the detectability of high frequency noise which generally accompanies a weak signal. That is, post-demodulator filter 38 helps to reduce the effects of weak AM signals received at the antenna. Post-demodulator filter 38 provides a filtered audio signal to soft mute unit 40. Soft mute unit 40 attenuates the filtered audio signal proportional to the signal quality. That is, the worse the signal quality, the greater the attenuation, thus further reducing the effects of noise in the AM signal. Soft mute unit 40 therefore provides a filtered and attenuated audio signal at its output.

Also, in the illustrated embodiment, the bandwidths of demodulator filters 36 and 38 are the same in order to achieve optimal noise performance. In this embodiment (where $I_2$, $Q_2$ and the unfiltered audio signal are baseband signals), computational efficiency may be improved by using a same set of coefficients for both demodulator filters 36 and 38. As illustrated in FIG. 1, pre-demodulator filter 36 may be implemented by using cascaded filters where each cascaded filter is of a same predetermined order and uses a same set of coefficients. Therefore, FIG. 1 illustrates two pairs of substantially identical cascaded filters within pre-demodulator filter 36: filter 20 cascaded with filter 24, and filter 22 cascaded with filter 26. Filter 20 receives signal I from low pass filter 18 and provides a first filtered signal $I_1$ to filter 24 which produces a second filtered signal $I_2$ which is provided to AM demodulator and gain control 28. Similarly, filter 22 receives signal Q from low pass filter 18 and provides a first filtered signal $Q_1$ to filter 26 which produces a second filtered signal $Q_2$ which is provided to AM demodulator and gain control 28. Post-demodulator filter 38, as illustrated in FIG. 1, may also be implemented using cascaded filters where each cascaded filter is of a same predetermined order and uses a same set of coefficients. Therefore, FIG. 1 illustrates a pair of substantially identical cascaded filters within post-demodulator filter 38: filter 30 and filter 32. Filter 30 receives the unfiltered audio signal from AM demodulator and gain control 28 and provides a first filtered signal to filter 32. Filter 32 therefore outputs a second filtered signal as the filtered audio signal to soft mute unit 40.

In the illustrated embodiment, note that all of the filters (filters 20, 24, 22, 26, 30, and 32) are substantially identical filters in that they are of a same predetermined order and use a same set of coefficients. Therefore, filter control unit 34 may provide a same set of coefficients to each of the filters. This results in pre-demodulator filter 36 and post-demodulator filter 38 having the same bandwidths. Furthermore, since only a single set of filter coefficients is needed, the filter coefficients may be calculated in real time at each sample of the input signal (or at each block or predetermined number of samples). The resulting calculation efficiency allows pre-demodulator filter 36 and post-demodulator filter 38 to be implemented as continuously variable filters. Also, since the filter coefficients may be recalculated at each sample or block, storage space is not required for storing tables of previously calculated filter coefficients. Also, in the illustrated embodiment, each of the filters 20, 24, 22, 26, 30, and 32 are first order filters, which further reduces computational complexity. In the illustrated embodiment, they are implemented as basic first order filters, thus requiring less coefficients to be calculated, as will be described in more detail below.

Note that in alternate embodiments, filters 20, 24, 22, 26, 30, and 32 may be higher order filters. Also, in alternate embodiments, more than two cascaded filters may used to filter each signal. For example, three cascaded filters of a same predetermined order and using a same set of coefficients may be used to filter each of I, Q, and unfiltered audio signal. Also, in an alternate embodiment, each of these signals may be filtered by a different number of cascaded filters. In yet another alternate embodiment, pre-demodulator filter 36 and post-demodulator filter 38 may be of different orders and use a different set of coefficients. Pre-demodulator filter 36, post-demodulator filter 38, AM demodulator and gain control 28, soft mute unit 40, and filter control unit 34 may be implemented in a data processing unit, such as, for example, a digital signal processor (DSP). For example, they may be implemented as software stored in computer readable storage that is accessed and executed by a central processor. Alternatively, they may be implemented in hardware. In yet an alternate embodiment, they may be implemented in a combination of hardware, software, and firmware. Therefore, note that pre-demodulator filter 36, post-demodulator filter 38, AM demodulator and gain control 28, soft mute unit 40, and filter control unit 34 may be implemented on a same integrated circuit. Also note that soft mute unit 40 and the gain control portion of AM demodulator and gain control 28 are optional.

FIG. 2 illustrates one embodiment of filter control unit 34 of FIG. 1. Note that the algorithm which will be described in reference to FIG. 2 may be stored in a storage unit within a DSP and executed on a sample or a block (i.e. a predetermined number of samples) basis of the input AM signal I, Q. Block 50 of filter control unit 34 receives SSI which provides an indicator of the strength of the desired channel within the AM signal received at the antenna. The desired channel, for example, may be indicated by a tuner knob within an AM radio indicating a particular frequency. The output of block 50 is $freq_1$ which indicates a first possible cut-off frequency. A filter possessing the first possible cut-off frequency optimizes the listenability of the unfiltered audio signal for a given SSI condition. Note that, as will be described in more detail below, listenability may be a subjective criteria corresponding to an individual listener. Block 52 of filter control unit 34 receives ADJI which provides an indicator of the interference of channels adjacent to the desired channel within the AM signal. The output of block 52 is $freq_2$ which indicates a second possible cut-off frequency. A filter possessing the second possible cut-off frequency optimizes the listenability of the unfiltered audio signal for a given ADJI condition. Therefore, blocks 50 and 52 provide different possible cut-off frequencies which attempt to optimize listenability based on different channel conditions. That is, filter control unit 34 may receive other signal quality indicators in addition to or in place of SSI, ADJI, or both for use in determining possible cutoff frequencies.

Note that as used herein, a cut-off frequency refers to the highest frequency of the passband of a filter. In one embodiment, this cut-off frequency may be the half-power point or the point at which the output signal is attenuated 3 dB from the input signal level. Alternatively, the cut-off frequency may be the point at which a stop band starts. Therefore, note that any particular point of attenuation may be used to define the cut-off frequency. One example of the equations used to determine the possible cut-off frequencies $freq_1$ and $freq_2$ will be described in more detail in reference to FIGS. 3 and 4.

Referring back to FIG. 2, $freq_1$ and $freq_2$ are provided to block 54 which selects the minimum of the two frequencies as $freq_{min}$. The cut-off frequency specified by $freq_{min}$ therefore provides the optimal listenability based on the worse of the two channel conditions SSI and ADJI. Note that in alternate embodiments, other channel conditions other than or in addition to SSI and ADJI may be used to determine possible cut-off frequencies. Therefore, block 54 may select a cut-off frequency from more than just two possibilities. Also, in an alternate embodiment, $freq_{min}$ may correspond to a weighted average of the different possible cut-off frequencies (or a subset thereof). Furthermore, although not shown, alternate embodiments may perform further optimization of the selected frequency, $freq_{min}$.

Block 56 receives $freq_{min}$ and calculates the filter coefficients $a_0$, $a_1$, $b_0$, and $b_1$. That is, in the current embodiment, each of filters 20, 24, 22, 26, 30, and 32 has a first order transfer function H(z) of the following form.

Equation 1: $$H(z) = \frac{b_0 + b_1 z^{-1}}{a_0 + a_1 z^{-1}}$$

(Note that equation 1 corresponds to a first order infinite impulse response, IIR, filter.) Therefore, the output of filter control unit 34 provides the filter coefficients to each of filters 20, 24, 22, 26, 30 and 32, based on SSI and ADJI. The equations used to determine $a_0$, $a_1$, $b_0$, and $b_1$ will be described in further detail in reference to FIGS. 5 and 6 below. Note that, as described above, due to the simplicity in calculating four coefficients for the first order filters, the coefficients may be calculated on a per sample or block basis, which reduces the amount of storage required and the computation complexity. However, alternate embodiments may derive different equations than those shown in blocks 50, 52, 54, and 56 of FIG. 2 and use higher order filters.

FIG. 3 illustrates, in graph form, a relationship between SSI and cut-off frequency $freq_1$ which may used to derive the following equation of block 50 of FIG. 2.

$freq_1 = c_1 \cdot SSI + c_2$      Equation 2

Note that equation 2 corresponds to the graph illustrated in FIG. 3 labeled with the same equation. The graph of FIG. 3 represents the concept that as signal strength (i.e. SSI) decreases, the optimal bandwidth of the pre- and post-demodulator filters 36 and 38 decreases proportionally. This relationship between SSI and cut-off frequency can be approximated as a linear relationship defined by equation 2. Note that in alternate embodiments, other approximations (other than linear approximations) may be used. In one embodiment, the linear relationship (equation 2) is determined using a two-point linear approximation. That is, two values of SSI may be selected based on a good signal strength and a bad signal strength (i.e. a high value of SSI and a low value of SSI). For each value of SSI, the output audio signal can be listened to while varying $freq_1$ in order to determine the value of $freq_1$ that provides the best listenability for the listener. From the linear approximation, the values of $c_1$ and $c_2$ may be determined. Alternatively, more than two values may be used. If more than two values are used, other higher order approximations may be used to define $freq_1$ as a function of SSI. Note that, in one embodiment, $freq_1$ should not exceed the maximum single-sided bandwidth of the AM signal received at the antenna.

FIG. 4 illustrates, in graph form, a relationship between ADJI and cut-off frequency $freq_2$ which may used to derive the following equation of block 52 of FIG. 2.

$freq_2 = c_3 \cdot ADJI + c_4$      Equation 3

Note that equation 3 corresponds to the graph illustrated in FIG. 4 labeled with the same equation. The graph of FIG. 4 represents the concept that as adjacent signal interference (i.e. ADJI) increases, the optimal bandwidth of the pre- and post-demodulator filters 36 and 38 decreases proportionally. This relationship between ADJI and cut-off frequency can also be approximated as a linear relationship defined by equation 3. Note that in alternate embodiments, other approximations (other than linear approximations) may be used. In one embodiment, the linear relationship (equation 3) is determined using a two-point linear approximation. That is, two values of ADJI may be selected based on a low value of ADJI and a high value of ADJI. For each value of ADJI, the output audio signal can be listened to while varying $freq_2$ in order to determine the value of $freq_2$ that provides the best listenability for the listener. From the linear approximation, the values of $c_3$ and $c_4$ may be determined. Note that in the current embodiment illustrated in FIG. 4, $c_3$ provides a negative value corresponding to a negative slope. Alternatively, more than two values may be used. If more than two values are used, other higher order approximations may be used to define $freq_2$ as a function of ADJI. Note that, in one embodiment, $freq_2$ should not exceed the maximum single-sided bandwidth of the AM signal received at the antenna.

Therefore, alternate embodiments may define $freq_1$ and $freq_2$ in a variety of different ways, where $freq_1$ is a function of SSI and $freq_2$ is a function of ADJI. In one embodiment, once these functions are defined, the coefficients of the function (such as, for example, $c_1$, $c_2$, $c_3$, and $c_4$) may be stored in a storage unit of a DSP because they only need to be calculated once.

Figure 6:
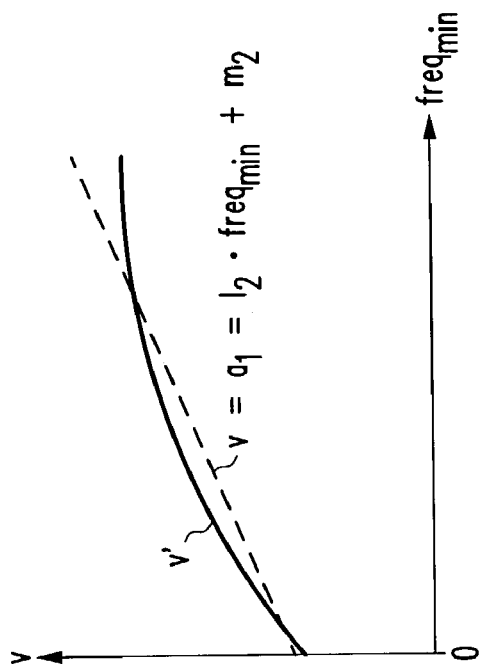
Figure 5:
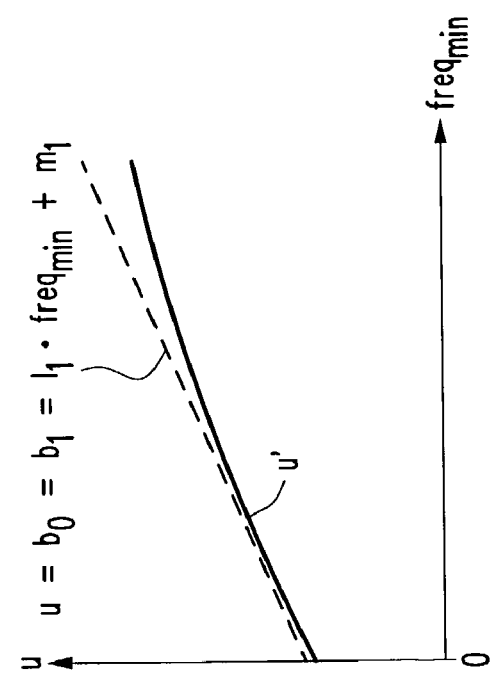

FIGS. 5 and 6 illustrate, in graph forms, linear approximations which may be used to determine the coefficient equations of block 56 of FIG. 2. The following equations may be used to determine the filter coefficients $a_0$, $a_1$, $b_0$, and $b_1$.

$b_0 = b_1 = l_1 \cdot freq_{min} + m_1$      Equation 4

$a_0 = 1$      Equation 5

$a_1 = l_2 \cdot freq_{min} + m_2$      Equation 6

Note that due to the equations chosen for the filter coefficients, computation complexity is further reduced because only two calculations (e.g. equations 4 and 6) are needed on a per sample or block basis to determine all four coefficients. These equations (equations 4–6) may be determined by using a curve fitting algorithm, as will be described below.

A classic first order RC filter frequency transfer function, as known in the art, can be expressed as follows.

Equation 7: $$H(j\omega) = \frac{1}{1 + j\omega/\omega_c}$$

In the above equation, $\omega_c$ corresponds to the cut-off frequency of the filter response. Using a bilinear transform and pre-warping the frequency, as known in the art, the following first order IIR digital filter frequency transfer function may be obtained. (Note that freq$_{min}$ is used as the cut-off frequency.)

Equation 8: $$H(z) = \frac{\left(\frac{1}{1 + \frac{1}{\tan(\pi \cdot freq_{min}/f_s)}}\right) \cdot (1 + z^{-1})}{1 + \left(\frac{1 - \frac{1}{\tan(\pi \cdot freq_{min}/f_s)}}{1 + \frac{1}{\tan(\pi \cdot freq_{min}/f_s)}}\right) \cdot z^{-1}}$$

In the above equation, $f_s$ corresponds to the sampling frequency of the system. For example, in one embodiment, $f_s$ may be defined by the sampling rate of A/D converter 16 and any decimation and/or interpolation following A/D converter 16. Equation 8 may be rewritten in the following form where the term prior to the $(1+z^{-1})$ is represented by u' and the term immediately preceding the $z^{-1}$ in the denominator is represented by v'.

Equation 9: $$H(z) = \frac{u'(1 + z^{-1})}{1 + v' \cdot z^{-1}}$$

Curves representing u' and v' are illustrated in the graphs of FIGS. 5 and 6, respectively. Note that these graphs are used only as examples for ease of explanation and may not correspond to the actual transfer function represented by equation 9. That is, the actual curves represented by u' and v' may be of a different form. The portion of the curves represented by u' and v' within a particular frequency range of interest may be approximated by u and v, respectively. This frequency range of interest, in one embodiment, may be defined as 0 to the maximum AM broadcast bandwidth. For example, in one embodiment, it may defined as 0 to 5 kHZ. As illustrated in FIGS. 5 and 6, u and v are linear approximations of the portions of u' and v' within the frequency ranges of interest. Therefore, note that Equation 9 can be approximated as follows.

Equation 10: $$H(z) \cong \frac{u(1 + z^{-1})}{1 + v \cdot z^{-1}}$$

In equation 10, u corresponds to the approximation of u' and v corresponds to the approximation of v'. In the examples of FIGS. 5 and 6, each of u' and v' are approximated using a linear curve fit approximation, thus resulting in the following equations.

$u = l_1 \cdot freq_{min} + m_1$     Equation 11

$v = l_2 \cdot freq_{min} + m_2$     Equation 12

These equations are therefore used to provide the coefficients $a_1$, $b_0$, and $b_1$ where $u = b_0 = b_1$ and $v = a_1$. Note that alternate embodiments may use other curve fits to determine approximations u and v other than linear approximations.

Therefore, it can be appreciated how power and computation complexity may be reduced by using pre- and post-demodulator filters having a same bandwidth. This also allows the bandwidth of the AM signal before the demodulator to be equivalent to the bandwidth of the audio message after the demodulator. Furthermore, AM processing may be further improved by using cascaded filters. Complexity is also reduced by using cascaded filters which are of a same predetermined order and use a same set of coefficients.

In the foregoing specification, the invention has been described with reference to specific embodiments. However, one of ordinary skill in the art appreciates that various modifications and changes can be made without departing from the scope of the present invention as set forth in the claims below. For example, the block diagrams may have different blocks than those illustrated and may have more or less blocks or be arranged differently. Also, some blocks may be combined. Also, referring back to FIG. 1, in an alternate embodiment, a passband filter may be used for pre-demodulator filter 36 while a low pass filter may still be used for post-demodulator filter 38 where coefficients for these filters are chosen such that their bandwidths are still the same. Therefore, different filter types may be used, as appropriate. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for processing an amplitude modulated (AM) signal, comprising:
   providing an input signal to a first filter having a predetermined order and having a set of coefficients, the first filter being a pre-demodulator filter;
   outputting a first output signal from the first filter;
   demodulating the first output signal to provide an unfiltered audio signal;
   providing the unfiltered audio signal to a second filter having the same predetermined order and the same set of coefficients as the first filter, the second filter being a post-demodulation filter; and
   outputting a second signal from the second filter.

2. A method as in claim 1, further comprising:
   performing pre-demodulation filtering using two filters which have the same predetermined order and the same set of coefficients.

3. A method as in claim 2, further comprising:
   providing a common filter control that provides the same set of coefficients to the first filter and the second filter.

4. A method as in claim 1, further comprising:
   implementing the pre-demodulator filter with a same number of filters as the post-demodulator filter, all filters being controlled by a same filter control unit.

5. A method as in claim 1, wherein the predetermined order is first order and the first filter and the second filter are infinite impulse response (IIR) filters.

6. A method as in claim 1, further comprising:
selectively modifying the set of coefficients.

7. A method as in claim 6, further comprising:
using a linear approximation to determine how to modify at least a portion of the set of coefficients.

8. A method as in claim 1, further comprising:
receiving a signal quality indicator.

9. A method as in claim 8, wherein receiving the signal quality indicator comprises:
receiving a signal strength indicator.

10. A method as in claim 8, wherein receiving the signal quality indicator comprises:
receiving an adjacent channel interference indicator.

11. A method as in claim 1, further comprising:
using a signal strength indicator and an adjacent channel interference indicator to selectively modify the set of coefficients.

12. A method for processing an amplitude modulated (AM) signal, comprising:
providing an input signal to a first filter having a predetermined order and having a set of coefficients;
outputting a first output signal from the first filter;
providing the first output signal to a second filter having the same predetermined order and having the same set of coefficients;
outputting a second signal from the second filter;
using a predetermined linear polynomial of the signal strencrth indicator to determine a first cut-off frequency;
using a predetermined linear polynomial of the adjacent channel interference indicator to determine a second cut-off frequency; and
using a signal strength indicator and an adjacent channel interference indicator to selectively modify the set of coefficients.

13. A method as in claim 12, further comprising:
selecting a minimum frequency of the first cut-off frequency and the second cut-off frequency.

14. A method as in claim 13, further comprising:
using a first linear polynomial of the minimum frequency in determining a first portion of the set of coefficients; and
using a second linear polynomial of the minimum frequency in determining a second portion of the set of coefficients.

15. A method as in claim 1, further comprising:
providing gain control of the second signal.

16. A method as in claim 1, further comprising:
providing soft muting of the second signal.

17. An amplitude modulation (AM) receiver, comprising:
an input portion having a tuner for selectively receiving an input modulated signal and providing an intermediate signal;
a first filter, coupled to the input portion for receiving the intermediate signal, the first filter having a transfer function;
a second filter, coupled to the first filter, having a same transfer function as the first filter, the first filter and the second filter forming a pre-demodulator filter;
a demodulator, coupled to the second filter, for demodulating an output of the pre-demodulator filter and providing an unfiltered audio sinial;
a third filter, coupled to the demodulator for receiving the unfiltered audio signal, the third filter having the same transfer function as the first filter,
a fourth filter, coupled to the third filter, having the same transfer function as the first filter, the third filter and the fourth filter forming a post-demodulator filter; and
a filter control unit for controlling the first, second, third, and fourth filters.

18. A receiver as in claim 17, wherein the first, second, third, and fourth filters are first order and are infinite impulse response (IIR) filters.

19. A receiver as in claim 17, wherein the filter control unit uses at least one linear approximation to approximate the same transfer function.

20. A receiver as in claim 17, wherein the at least one linear approximation is used to selectively modify coefficients of the same transfer function.

21. An amplitude modulation (AM) receiver, comprising:
an input portion;
a pre-demodulator filter, coupled to the input portion, having a transfer function;
a demodulator, coupled to the pre-demodulator filter to demodulate the output of the pre-demodulator filter;
a post-demodulator filter, coupled to the demodulator to receive an output of the demodulator, having a same transfer function as the pre-demodulator filter; and
a filter control unit, coupled to the pre-demodulator filter and to the post-demodulator filter, the filter control unit providing the same filter coefficients to the pre-demodalator filter and the post-demodulator filter, the we-demodulator filter and the post-demodulator filter each having substantially the same bandwidth.

22. A receiver as in claim 21, wherein the pre-demodulator filter comprises a first filter having a set of coefficients and a second filter having a same set of coefficients.

23. A receiver as in claim 22, wherein the post-demodulator filter comprises a third filter and a fourth filter.

24. A receiver as in claim 23, wherein the first, second, third and fourth filters are first order and are infinite impulse response (IIR) filters.

25. A receiver as in claim 21, wherein the filter control unit uses at least one linear approximation to approximate the same transfer function.

* * * * *

UNITED STATES PATENT AND TRADEMARK OFFICE
CERTIFICATE OF CORRECTION

| | | |
|---|---|---|
| PATENT NO. | : 7,092,465 B2 | Page 1 of 1 |
| APPLICATION NO. | : 10/294511 | |
| DATED | : November 14, 2002 | |
| INVENTOR(S) | : Jon D. Hendrix et al. | |

It is certified that error appears in the above-identified patent and that said Letters Patent is hereby corrected as shown below:

Column 10, Line 9, Claim No. 17:

Change "sinial" to --signal--

Column 10, Line 42, Claim No. 21:

Change "we-demodulator" to --pre-demodulator--

Signed and Sealed this

Nineteenth Day of June, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,092,465 B2 | Page 1 of 1 |
| APPLICATION NO. | : 10/294511 | |
| DATED | : August 15, 2006 | |
| INVENTOR(S) | : Jon D. Hendrix et al. | |

It is certified that error appears in the above-identified patent and that said Letters Patent is hereby corrected as shown below:

Column 10, Line 9, Claim No. 17:

Change "sinial" to --signal--

Column 10, Line 42, Claim No. 21:

Change "we-demodulator" to --pre-demodulator--

This certificate supersedes Certificate of Correction issued June 19, 2007.

Signed and Sealed this

Tenth Day of July, 2007

JON W. DUDAS
*Director of the United States Patent and Trademark Office*